United States Patent [19]

Schuermeyer

[11] Patent Number: 4,532,695

[45] Date of Patent: Aug. 6, 1985

[54] METHOD OF MAKING SELF-ALIGNED IGFET

[75] Inventor: Fritz L. Schuermeyer, Yellow Springs, Ohio

[73] Assignee: The United States of America as represented by the Secretary of the Air Force, Washington, D.C.

[21] Appl. No.: 394,591

[22] Filed: Jul. 2, 1982

[51] Int. Cl.³ .......................................... H01L 21/265
[52] U.S. Cl. .................................. 29/571; 29/576 B; 29/578; 148/1.5
[58] Field of Search ................... 148/1.5; 29/571, 590; 357/23

[56] References Cited

U.S. PATENT DOCUMENTS

| | | | |
|---|---|---|---|
| 3,791,023 | 2/1974 | Scherber | 29/571 |
| 4,139,402 | 2/1979 | Steinmaier et al. | 357/23 |
| 4,160,261 | 7/1979 | Casey, Jr. et al. | 357/23 |
| 4,182,636 | 1/1980 | Dennard et al. | 148/187 |
| 4,266,985 | 5/1981 | Ito et al. | 29/571 |
| 4,268,844 | 5/1981 | Meiners | 357/23 |
| 4,291,327 | 9/1981 | Tsang | 357/52 |
| 4,319,395 | 3/1982 | Lund et al. | 29/571 |
| 4,325,073 | 4/1982 | Hughes et al. | 357/22 |
| 4,348,746 | 9/1982 | Okabayashi et al. | 29/571 |
| 4,364,167 | 12/1982 | Donley | 29/571 |

FOREIGN PATENT DOCUMENTS 57-18363  1/1982  Japan ............................ 357/23 NS

*Primary Examiner*—Brian E. Hearn
*Assistant Examiner*—Hunter L. Auyang
*Attorney, Agent, or Firm*—Donald J. Singer; Bernard E. Franz

[57] ABSTRACT

The IGFET is formed on a GaAs wafer which is coated with a layer of $Si_3N_4$ and a $SiO_2$ layer. The $SiO_2$ is etched away in transistor areas, and ion implanting provides channel doping. A gate of refractory metal such as Mo is deposited and delineated. The gate and the $SiO_2$ act as masks for ion implantation of the source and drain. The refractory metal gate allows subsequent annealing at high temperatures to activate the ion implanted species.

15 Claims, 9 Drawing Figures

METHOD OF MAKING SELF-ALIGNED IGFET

RIGHTS OF THE GOVERNMENT

The invention described herein may be manufactured and used by or for the Government of the United States for all governmental purposes without the payment of any royalty.

BACKGROUND OF THE INVENTION

This invention relates to an improved self-aligned insulated gate field effect transistor (IGFET) and method for fabricating that device.

Self-alignment techniques are used routinely in silicon technology. These self-aligned IGFETs have reduced source and drain resistance over the non-self-aligned structures, resulting in improved performance. Examples are shown in U.S. Pat. No. by Dennard, 4,182,636 and by Lund et al, U.S. Pat. No. 4,319,395.

There is a need for ultrahigh speed electronic devices, in fields such as airborne radar and communication systems. It is anticipated that GaAs IGFETs will become an important part of these systems. Meiners U.S. Pat. No. 4,268,844 discloses an IGFET capable of operation at frequencies in excess of one GHz. The transistor substrate is a semi-insulating semiconductor which may be formed of Cr-doped GaAs, Tsang U.S. Pat. No. 4,291,327 forms IGFETs by growing a layer of controlled thickness on GaAs. Hughes et al U.S. Pat. No. 4,325,073 and Casey, Jr., U.S. Pat. No. 4,160,261 both disclose method of forming GaAs FETs.

The use of GaAs IGFETs with large interface state densities is described in my copending U.S. patent application Ser. No. 271,754 filed June 9, 1981, now U.S. Pat. No. 4,438,351 issued Mar. 20, 1984.

SUMMARY OF THE INVENTION

An object of this invention is to provide GaAs IGFETs having reduced source and drain resistance, to increase the gain and performance.

According to the invention, a self-alignment technique is used to fabricate GaAs metal insulator semiconductor (MIS) structures, also known as IGFETs. The crucial part of this structure is to use a refractory metal or a poly Si/metal silicide gate over a $Si_3N_4$ insulator. This gate structure allows subsequent annealing at high temperatures to activate ion implanted species.

DETAILED DESCRIPTION

It is known that source resistance and drain resistance decrease the performance of field effect transistors (FETs). The gain of the FET is reduced by the source resistance $R_s$ according to $G_m = G_m^1/(1 + G_m^1 R_s)$ where $G_m^1$ is the gain for a FET with $R_s = 0$. Furthermore, the switching speed of a transistor depends on the on-resistance of the transistor with improved speed performance for FETs with small values of on-resistance. The source and drain resistance of these FETs add to the on-resistance. Hence, minimum source and drain resistance is required for optimum performance of the FETs.

Self-alignment techniques have been developed for Si MOSFET technology. The predominantly used technology is the so-called Si-gate technology. Here, the transistor is fabricated up to the gate level. An ion implantation step is then used to form highly conductive areas for source and drain. In this ion implantation step, the gate acts as a mask for the ions and consequently the highly conductive areas extend up to the gate area, thereby reducing source and drain resistance. After implantation, the wafers are annealed for activation of the implanted species.

Figure 1:
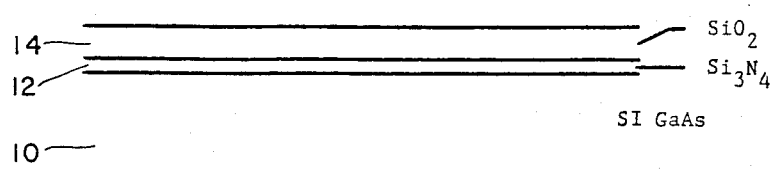
FIGS. 1–5 are diagrams showing steps in the fabrication of a self-aligned GaAs IGFET.
Figure 2:
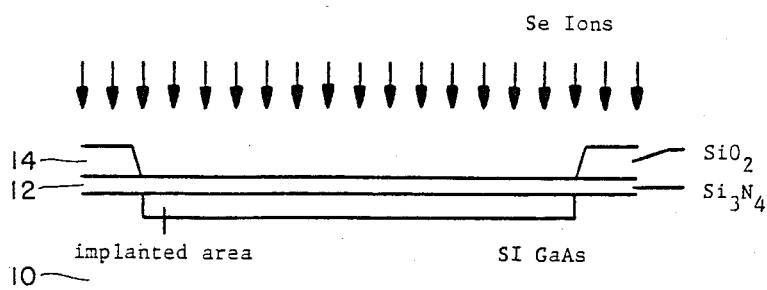
Figure 3:
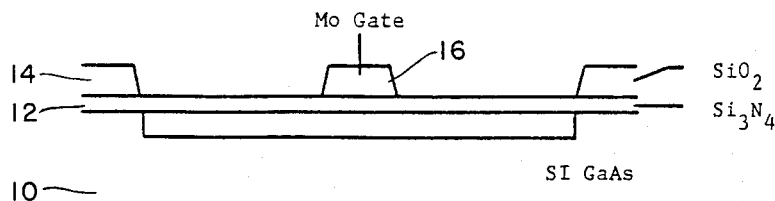
Figure 4:
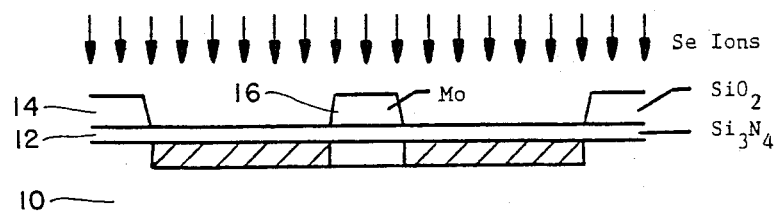
Figure 5:
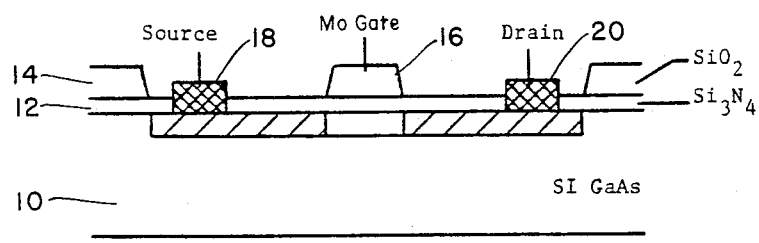
Figure 6:
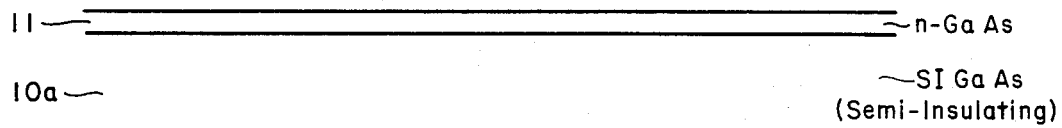
FIGS. 6–9 are diagrams showing initial steps in the fabrication of an alternative embodiment.

The preferred embodiment for the self-aligned GaAs IGFET is described now:

The starting material is properly polished, etched and cleaned semi-insulating (100) GaAs 10. Polishing, etching and cleaning methods for GaAs are well known. The GaAs must be selected such that it does not invert upon high temperature processing. The processing steps are shown in FIGS. 1–5. In FIG. 1, the semi-insulating GaAs wafer 10 has been coated with approximately 100 nm of a plasma enhanced deposited $Si_3N_4$ layer 12 and a phosphorous-doped 1 μm thick $SiO_2$ layer 14. The $SiO_2$ film is then etched off in the areas where the transistors will be located and the $SiO_2$ is reflown at elevated temperatures to eliminate sharp steps. Techniques for the above described steps are well known. The $SiO_2$ film allows the metallization pattern to run on a relatively low dielectric constant material ($\epsilon SiO_2 = 3.9$; $\epsilon GaAs = 10.9$). Consequently, capacitance effects between lines are minimized. The $SiO_2$ film also provides alignment marks for subsequent processes. Next, the sample is ion implanted with the $SiO_2$ film 14 acting as a mask (FIG. 2). The preferred implantation species is Se at 400 keV. The dose required depends on the threshold voltage and conductance values desired. A $2 \times 10^{12}$ ions $cm^{-2}$ is a typical value. This ion implantation step provides the channel doping. The fabrication process is continued by deposition and delineation of the gate 16. The preferred metal for the gate is Mo with a thickness of approximately 500 nm. A typical gate length is 1 μm. The gate is delineated with commonly used techniques such as lift-off (FIG. 3). Next, the source and drain region are implanted to provide an n+ region extending to the gate region from source and drain. For this ion implantation the $SiO_2$ and the gate act as masks. Again, the preferred species is Se, implanted at 400 keV with a $5 \times 10^{13}$ ions $cm^{-2}$ dose (FIG. 4). Now the sample is annealed with the originally deposited $Si_3N_4$ acting as an annealing cap. The annealing is performed in this preferred process at 800° C. for 30 minutes. This annealing is performed in order to activate the species, implanted during the two previous implantation processes. The FET is completed by etching holes into the $Si_3N_4$ for source and drain contacts 18 and 20, to deposit source and drain and to sinter the device for activation of these contacts (FIG. 5). Commonly used contact metal is a Au-Ge-Ni film. The sintering is performed at 400° C. for 1 minute.

There exists many variations to this process. Some are listed below. An n-type epi-material may be used as a starting material and mesa structures are then etched in this sample. This allows the omission of the first ion implantation since the channel doping is already present. Another variation to the process would be the use of different implantation species, such as Si. A further variation to the process would be to remove the $Si_3N_4$ over the device area after the first ion implantation and then to deposit a new $Si_3N_4$ film. This film may be thinner than the original (say 500A) for reduced threshold voltage. Yet another variation would be to deposit another dielectric film over the entire structure, such as $Si_3N_4$ or $SiO_2$ before annealing. This insulator would provide an insulation for a possible further metallization layer. A final variation would be to use a different gate metal system, e.g., an n-type poly Si or $MoSi_2$ system. An advantage of this system would be that a $SiO_2$ film can be grown thermally, which acts as a passivation to the metal system and also forms an insulator between a next level metallization. The oxidation process may be able to activate the implanted species and the annealing process may be eliminated.

Figure 7:
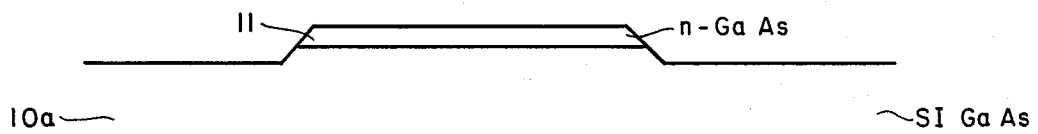
Figure 8:
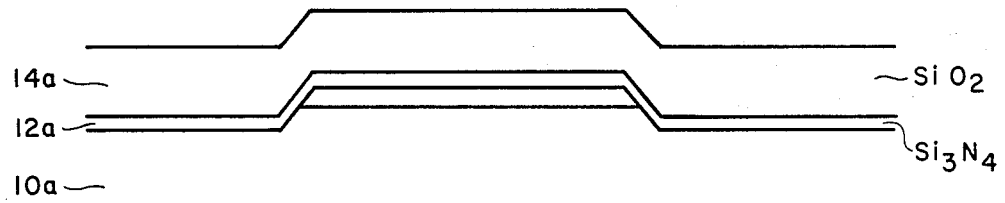
Figure 9:
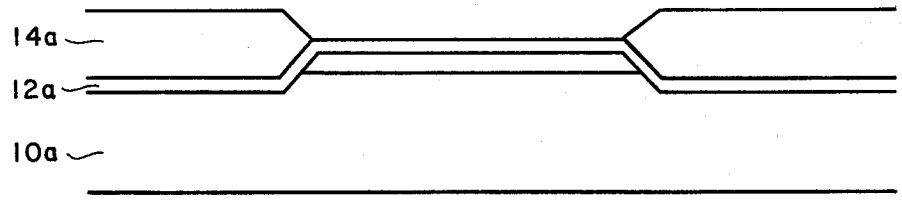

The embodiment using an n-type epi-material and mesa structures is shown in FIGS. 5-9 (in place of FIGS. 1 & 2), which is followed by the steps shown in FIGS. 3-5. As shown in FIG. 9, the starting material is a semi-insulating substrate 10a, on which there is a layer 11 of n-type epitaxial material. As shown in FIG. 7, mesas are formed by etching through the epi layer 11 into the semi-insulating layer 10a. The top of each mesa is used for forming one active transistor area. As shown in FIG. 8, the next step comprises coating the substrate with plasma enhanced deposited $Si_3N_4$ and a $SiO_2$ layer. Next the $SiO_2$ layer is etched away over the transistor area on the mesa, as shown in FIG. 9. The process of forming the transistor then continues as shown in FIGS. 3, 4 and 5.

Thus, while preferred constructional features of the invention are embodied in the structure illustrated herein, it is to be understood that changes and variations may be made by the skilled in the art without departing from the spirit and scope of my invention.

I claim:

1. A self-aligned process for fabricating a semiconductor device which comprises the steps of:
   a. providing a semi-insulating GaAs substrate;
   b. coating the substrate with a plasma enhanced deposited $Si_3N_4$ layer and a $SiO_2$ layer;
   c. etching off the $SiO_2$ layer in areas where transistors will be located;
   d. ion implanting, with the $SiO_2$ layer acting as a mask, which provides channel doping;
   e. depositing and delineating a gate of conductive refractory material;
   f. forming source and drain regions by ion implantation to provide n+ region extending to the gate region, with the $SiO_2$ layer and the gate acting as masks;
   g. annealing with the $Si_3N_4$ acting as an annealing cap;
   h. etching holes into the $Si_3N_4$ for source and drain contacts, depositing the source and drain contacts and sintering the device for activation of these contacts.

2. The process of claim 1, wherein said gate is made of Mo, and said $SiO_2$ layer is phosphorous doped.

3. The process of claim 1 or 2, wherein the implantation species in steps d and f is Se at 400 keV.

4. The process of claim 3, wherein the ion implantation dose in step d has a typical value of $2 \times 10^{12}$ ions $cm^{-2}$, and in step f a value of $5 \times 10^{13}$ ions $cm^{-2}$.

5. The process of claim 1 or 2, where the annealing of step g is performed at 800° C. for 30 minutes.

6. The process of claim 5, wherein the contact metal used in step h is a Au-Ge-Ni film, the sintering being performed at 400° C. for 1 minute.

7. The process of claim 6, wherein the implantation species of steps d and f is Se at 400 keV, the implantation dose in step d having a typical value of $2 \times 10^{12}$ ions $cm^{-2}$, and in step f a value of $5 \times 10^{13}$ ions $cm^{-2}$.

8. The process of claim 1 or 2, further including a step following step d of removing the $Si_3N_4$ and then depositing a new $Si_3N_4$ film which is thinner than the original.

9. The process of claim 1 or 2, further including a step before the annealing step g of depositing another dielectric film over the entire structure.

10. The process of claim 9, wherein said another dielectric film is $Si_3N_4$.

11. The process of claim 9, wherein said another dielectric film is $SiO_2$.

12. A self-aligned process for fabricating a semiconductor device which comprises the steps of:
   a. providing a semi-insulating GaAs substrate on which there is an n-type epimaterial layer, into which mesa structures are then etched through the epimaterial layer, with the top of each mesa retaining the epimaterial layer for an active transistor area;
   b. coating the substrate with plasma enhanced deposited $Si_3N_4$ and a $SiO_2$ layer, and etching away the $SiO_2$ layer over the transistor area;
   c. depositing and delineating a gate of conductive refractory material in the transistor area;
   d. forming source and drain regions in the transistor area on opposite sides of the gate by ion implantation, with the $SiO_2$ layer and the gate acting as masks;
   e. annealing; and
   f. forming source and drain contacts.

13. A self-aligned process for fabricating a semiconductor device which comprises the steps of:
   a. providing a semi-insulating GaAs substrate, coated with $Si_3N_4$ and then a $SiO_2$ layer, the $SiO_2$ layer being etched away and an active layer of the GaAs substrate being n-type doped in areas formed where transistors will be located;
   b. depositing and delineating a gate of conductive material in said doped area; and
   c. forming source and drain regions by ion implantation of a species to form an n+ region, with the gate acting as a mask.

14. The process of claim 13, wherein the gate is formed from conductive material consisting of material selected from n-type poly Si and $MoSi_2$.

15. The process of claim 14, wherein the $SiO_2$ layer is grown thermally in an oxidation process, which acts as a passivation to the conductive material and also forms an insulator between a next level metallization, and wherein the oxidation process activates the implanted species.

* * * * *